United States Patent
Liu et al.

(10) Patent No.: US 8,735,983 B2
(45) Date of Patent: *May 27, 2014

(54) INTEGRATED CIRCUIT TRANSISTORS WITH MULTIPART GATE CONDUCTORS

(75) Inventors: Jun Liu, Santa Clara, CA (US); Albert Ratnakumar, San Jose, CA (US); Qi Xiang, San Jose, CA (US); Jeffrey Xiaoqi Tung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 251 days.

This patent is subject to a terminal disclaimer.

(21) Appl. No.: 12/324,791

(22) Filed: Nov. 26, 2008

(65) Prior Publication Data

US 2010/0127332 A1    May 27, 2010

(51) Int. Cl.
*H01L 21/02* (2006.01)
*H01L 21/336* (2006.01)
*H01L 21/8238* (2006.01)
*H01L 29/66* (2006.01)
*H01L 21/28* (2006.01)
*H01L 29/49* (2006.01)

(52) U.S. Cl.
CPC .. *H01L 21/823842* (2013.01); *H01L 29/66545* (2013.01); *H01L 21/28061* (2013.01); *H01L 29/49* (2013.01)
USPC ........... 257/344; 257/388; 257/407; 257/412; 257/E29.16; 257/E21.177; 438/283

(58) Field of Classification Search
CPC ................. H01L 21/823842; H01L 29/66545; H01L 21/28061; H01L 29/49
USPC .......... 438/197, 283, 364; 257/344, 368, 388, 257/407, 408, 412
See application file for complete search history.

(56) References Cited

U.S. PATENT DOCUMENTS 4,714,519 A * 12/1987 Pfiester .......................... 438/304
4,745,079 A *  5/1988 Pfiester .......................... 438/306

(Continued)

FOREIGN PATENT DOCUMENTS

| CN | 1192053 | 9/1998 |
|----|---------|--------|
| CN | 1938858 | 3/2007 |

(Continued)

OTHER PUBLICATIONS

Zhou et al. "A Novel Hetero-Material Gate (HMG) MOSFET for Deep-Submicron ULSI Technology", IEEE Transactions on Electron Devices, vol. 45, No. 12, Dec. 1998.

(Continued)

*Primary Examiner* — Alonzo Chambliss
(74) *Attorney, Agent, or Firm* — Treyz Law Group; G. Victor Treyz; Chih-Yun Wu (57) ABSTRACT

Metal-oxide-semiconductor transistors are provided. A metal-oxide-semiconductor transistor may be formed on a semiconductor substrate. Source and drain regions may be formed in the substrate. A gate insulator such as a high-K dielectric may be formed between the source and drain regions. A gate may be formed from multiple gate conductors. The gate conductors may be metals with different workfunctions. A first of the gate conductors may form a pair of edge gate conductors that are adjacent to dielectric spacers. An opening between the edge gate conductors may be filled with the second gate conductor to form a center gate conductor. A self-aligned gate formation process may be used in fabricating the metal-oxide-semiconductor transistor.

13 Claims, 11 Drawing Sheets

(56) References Cited

U.S. PATENT DOCUMENTS

| | | | |
|---|---|---|---|
| 4,894,801 A | 1/1990 | Saito et al. | |
| 5,031,088 A | 7/1991 | Tanaka | |
| 5,296,401 A | 3/1994 | Mitsui et al. | |
| 5,363,328 A | 11/1994 | Browning et al. | |
| 5,418,392 A * | 5/1995 | Tanabe | 257/336 |
| 5,514,604 A * | 5/1996 | Brown | 438/270 |
| 5,543,643 A * | 8/1996 | Kapoor | 257/262 |
| 5,576,238 A | 11/1996 | Fu | |
| 5,576,574 A * | 11/1996 | Hong | 438/291 |
| 5,583,067 A * | 12/1996 | Sanchez | 438/289 |
| 5,844,272 A | 12/1998 | Soderbarg et al. | |
| 5,977,591 A | 11/1999 | Fratin et al. | |
| 6,033,957 A | 3/2000 | Burns, Jr. et al. | |
| 6,091,118 A * | 7/2000 | Duane | 257/386 |
| 6,097,070 A * | 8/2000 | Mandelman et al. | 257/389 |
| 6,110,783 A | 8/2000 | Burr | |
| 6,255,174 B1 | 7/2001 | Yu | |
| 6,586,808 B1 * | 7/2003 | Xiang et al. | 257/407 |
| 6,620,679 B1 | 9/2003 | Tzeng et al. | |
| 6,653,698 B2 | 11/2003 | Lee et al. | |
| 6,674,139 B2 * | 1/2004 | Mandelman et al. | 257/412 |
| 6,949,423 B1 | 9/2005 | Ma et al. | |
| 7,193,269 B2 | 3/2007 | Toda et al. | |
| 7,315,067 B2 * | 1/2008 | Wang | 257/412 |
| 7,545,007 B2 * | 6/2009 | Greer et al. | 257/386 |
| 7,920,410 B1 | 4/2011 | Lee et al. | |
| 8,138,797 B1 | 3/2012 | Liu et al. | |
| 8,241,985 B2 * | 8/2012 | Hikida | 438/289 |
| 8,482,963 B1 | 7/2013 | Liu et al. | |
| 2001/0017390 A1 | 8/2001 | Long et al. | |
| 2002/0106844 A1 | 8/2002 | Kotani | |
| 2003/0141525 A1 | 7/2003 | Nowak | |
| 2003/0181005 A1 | 9/2003 | Hachimine et al. | |
| 2005/0124160 A1 * | 6/2005 | Chiu et al. | 438/689 |
| 2005/0164433 A1 * | 7/2005 | Doris et al. | 438/149 |
| 2005/0224897 A1 * | 10/2005 | Chen et al. | 257/410 |
| 2007/0029587 A1 | 2/2007 | Greer et al. | |
| 2007/0207575 A1 | 9/2007 | Taniguchi et al. | |
| 2007/0262382 A1 | 11/2007 | Ishii et al. | |
| 2008/0308870 A1 | 12/2008 | Faul et al. | |
| 2009/0321831 A1 * | 12/2009 | Cai et al. | 257/348 |
| 2010/0044801 A1 * | 2/2010 | Anderson et al. | 257/372 |
| 2010/0081239 A1 | 4/2010 | Min et al. | |
| 2010/0127332 A1 | 5/2010 | Liu et al. | |

FOREIGN PATENT DOCUMENTS

| | | |
|---|---|---|
| CN | 101030556 | 9/2007 |
| WO | 2005096387 | 10/2005 |

OTHER PUBLICATIONS

Xiang et al., U.S. Appl. No. 12/069,271, filed Feb. 8, 2008.
Xiang et al., U.S. Appl. No. 60/964,917, filed Aug. 16, 2007.
Kim et al., "Relaxing Conflict Between Read Stability and Writability in 6T SRAM Cell Using Asymmetric Transistors", IEEE Electron Device Letters, vol. 30, No. 8, Aug. 2009.
Rahim et al., U.S. Appl. No. 12/568,638, filed Sep. 28, 2009.

* cited by examiner (PRIOR ART)
FIG. 1

(PRIOR ART)

INTEGRATED CIRCUIT TRANSISTORS WITH MULTIPART GATE CONDUCTORS

BACKGROUND

This invention relates to transistors for integrated circuits, and more particularly, to transistors such as metal-oxide-semiconductor field effect transistors.

As process technology improves, it is becoming increasingly challenging to produce transistors for integrated circuits that meet design criteria. Advanced semiconductor fabrication techniques make it possible to produce metal-oxide-semiconductor transistors with short gate lengths. However, in devices with short gate lengths the source and drain regions can have an undesirably large impact on device behavior relative to the gate region. These undesirable short channel effects can be mitigated by using localized pocket implants.

Pocket implants help restore normal device operating characteristics to metal-oxide-semiconductor transistors with short gate lengths, but can introduce elevated leakage currents due to band-to-band tunneling. This can lead to unacceptable power consumption in integrated circuits with large numbers of transistors.

It would therefore be desirable to be able to provide ways in which to improve transistor performance on integrated circuits.

SUMMARY

Metal-oxide-semiconductor transistors may be provided on a semiconductor substrate. Source and drain regions for each transistor may be formed in the substrate. A gate insulator such as a high-K dielectric may be formed between the source and drain regions. A gate conductor that is formed on the gate insulator may include multiple gate conductors of different types. The gate conductors may, for example, be metals with different workfunctions. The gate conductors alter the band structure of the underlying substrate and thereby help to address short channel effects without generating increased levels of band-to-band tunneling leakage current.

In each transistor, a first of the gate conductors may form a pair of edge gate conductors that are adjacent to dielectric spacers at the edge of a channel under the gate of the transistor. During fabrication, sidewalls on the dielectric spacers may be exposed by removing a sacrificial layer. A conformal metal deposition step may be used to form thickened metal regions that serve as self-aligned masks structures. This allows the gate conductors to be formed using a self-aligned process.

Using etching techniques, an opening between the edge gate conductors may be created. During etching, the thickened metal regions formed during the conformal metal deposition step may serve to mask the gate conductor material adjacent to the spacers and thereby form the edge gate conductors. The opening that is formed between the edge gate conductors may be filled with a conductive material, thereby forming a center gate conductor. The conductive material for the center gate conductor may be the same as the material that is deposited during the conformal deposition step. Separate photolithographic masks need not be used for the edge and center gate conductors, so features with small lateral dimensions may be more accurately formed.

Further features of the invention, its nature and various advantages will be more apparent from the accompanying drawings and the following detailed description of the preferred embodiments.

DETAILED DESCRIPTION

The present invention relates to transistors such as metal-oxide-semiconductor transistors. The metal-oxide-semiconductor transistors may have gates that are formed from more than one type of metal. By altering the composition of the gate metal at different positions above the channel in a metal-oxide-semiconductor transistor, leakage currents can be minimized while simultaneously addressing short channel effects.

Metal-oxide-semiconductor transistors in accordance with the invention may be used on an integrated circuit. Integrated circuits in which the transistors may be used include programmable logic device integrated circuits, microprocessors, logic circuits, analog circuits, application specific integrated circuits, memory, digital signal processors, analog-to-digital and digital-to-analog converter circuits, etc.

Figure 1:
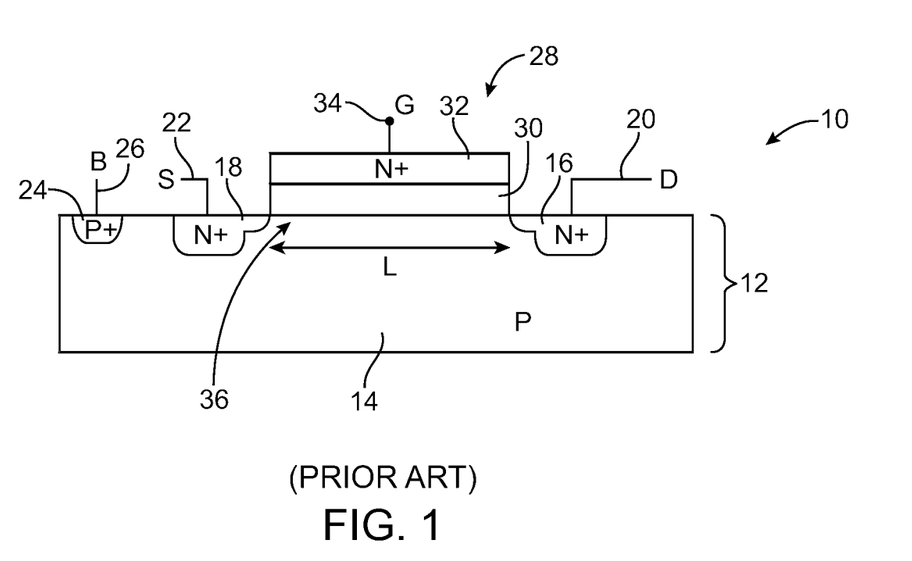
FIG. 1 is a cross-sectional diagram of a conventional metal-oxide-semiconductor transistor.

A cross-sectional view of a conventional metal-oxide-semiconductor field-effect transistor (MOSFET) is shown in FIG. 1. As shown in FIG. 1, transistor 10 may be formed from a well (body) region 14 formed in a silicon substrate 12. In the example of FIG. 1, transistor 10 is an n-channel metal-oxide-semiconductor (NMOS) transistor, so body region 14 is formed from silicon that has been doped p-type. P+ implant region 24 is used to form an ohmic contact between body terminal 26 of body B and the p-type silicon of body region 14.

Source S and drain D are formed on either side of gate G. Source S has an n+ implant region 18 to which source terminal 22 is connected. Drain D has an n+ implant region 16 to which drain terminal 20 is connected. Gate G has a gate terminal 34 that is electrically connected to gate structure 28. Gate structure 28 has a gate oxide layer 30 and a gate conductor 32. Gate oxide 30 is formed from silicon oxide. Gate conductor 32 may be formed from silicided doped polysilicon. In the example of FIG. 1, gate conductor 32 is formed from n+ polysilicon.

During operation of transistor 10 in a circuit, a gate voltage may be applied to gate G. If a sufficiently large positive voltage is applied to gate G, minority carriers (electrons in the NMOS transistor of FIG. 1), will form a channel in channel region 36 under gate G. Upon formation of the channel, current can flow readily between source S and drain D.

As shown in FIG. 1, transistor 10 may be characterized by a gate length L. Perpendicular to gate length L (i.e., into the page of FIG. 1), transistor 10 has an associated gate width W (typically larger than length L).

It is often advantageous to form transistors such as transistor 10 with gate lengths L that are as short as possible. Transistors with short gate lengths may be packed more densely on an integrated circuit, which allows logic designers to design more complex circuit and tends to reduce device costs. Smaller transistors may also exhibit faster switching speeds, which helps to improve circuit performance. However, use of short gate lengths such as gates that have lengths L less than about one micron can lead to nonideal transistor behavior. For example, transistors with short gate lengths may be subject to an increased risk of punchthrough. Short gate lengths can also lead to undesirably large amounts of power consumption due to increased leakage currents.

The leakage current through the drain of a typical metal-oxide-semiconductor transistor (sometimes referred to as Idoff) may be made up of a source leakage component (sometimes referred to as Isoff) and a body leakage current component (sometimes referred to as Iboff).

Figure 2:
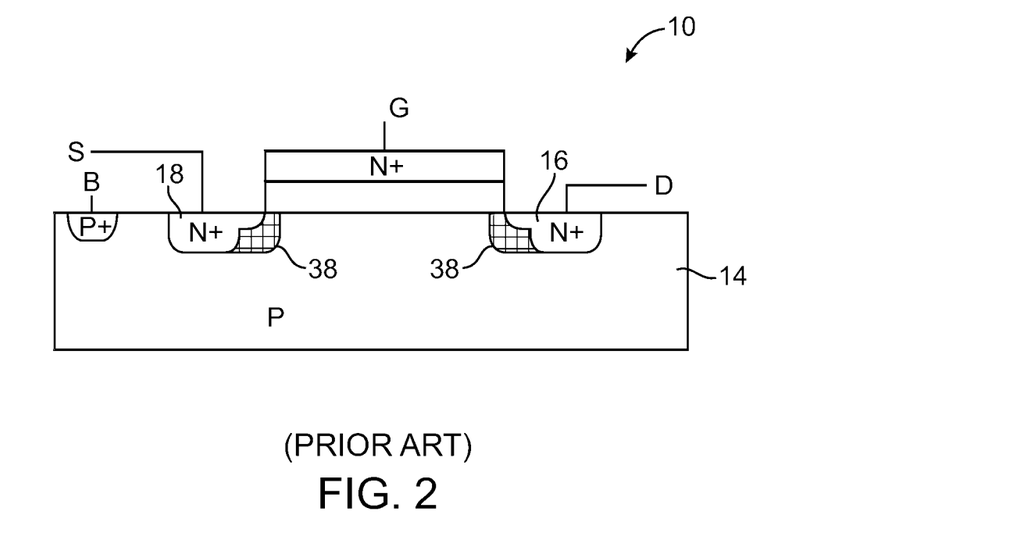
FIG. 2 is a cross-sectional diagram of a conventional metal-oxide-semiconductor transistor with pocket implants.

To address short channel effects such as increased punchthrough risk, it may be advantageous to provide a metal-oxide-semiconductor transistor with advanced doping profiles. For example, pocket implants may be formed near the source and drain regions to help prevent undesired incursions into the channel region. A conventional NMOS transistor 10 with pocket implants is shown in FIG. 2. As shown in FIG. 2, pocket implants 38 may be formed by ion implantation in the vicinity of source implant region 18 and drain implant region 16. The doping type of the pocket implants is opposite to that of the doping type of the adjoining source-drain regions 16 and 18. In the FIG. 2 arrangement, source-drain regions 16 and 18 are n-type, so pocket implants 38 are p-type.

Increased levels of leakage current Isoff may be addressed by adjusting the body bias of metal-oxide-semiconductor transistors. For example, if the power supply voltage on an integrated circuit Vcc is 1.0 volts, the body terminals B of NMOS transistors may be biased at −0.5 volts. This body bias will increase the threshold voltage Vt of the NMOS transistors and will therefore tend to reduce leakage current component Isoff.

Pocket implants such as pocket implants 38 of FIG. 2 help prevent punchthrough by maintaining small depletion layers between source-drain regions and the body region. However, pocket implants introduce sharp p+/n+ junctions that give rise to a potential for leakage current due to band-to-band tunneling.

Figure 3:
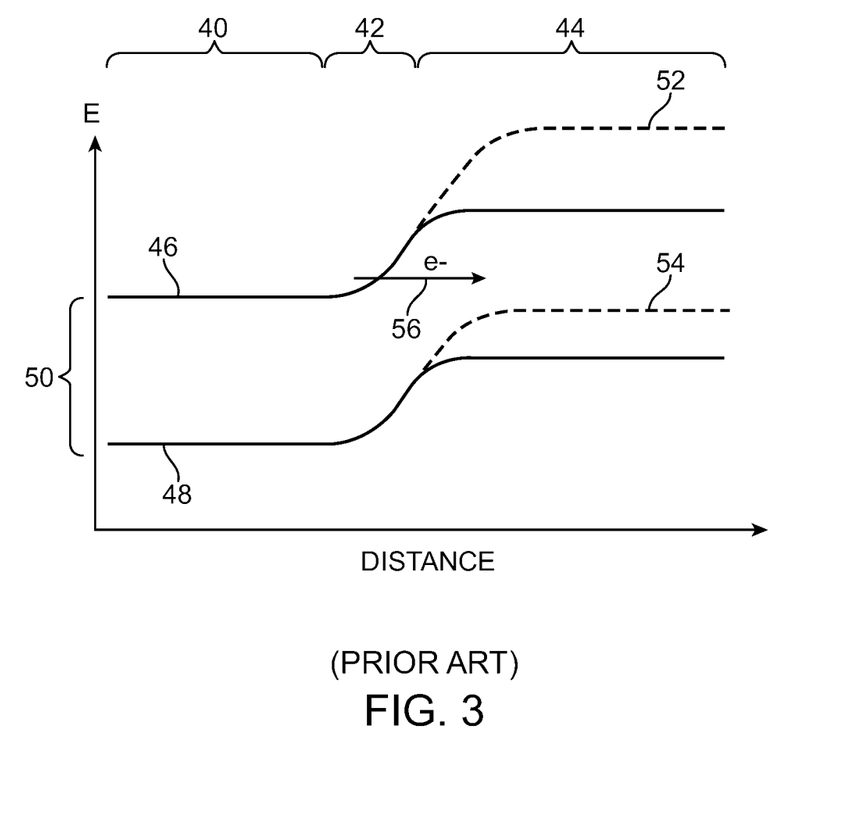
FIG. 3 is a diagram illustrating how band-to-band tunneling effects may arise in metal-oxide-semiconductor transistors with conventional pocket implants.

These band-to-band tunneling effects may be understood with reference to the energy band diagram of FIG. 3. In the diagram of FIG. 3, region 40 corresponds to a portion of an n+ implant region such as drain region 16 of FIG. 2. Region 44 corresponds to a portion of a p+ pocket implant region 38. Region 42 represents the depletion layer that forms between the p+ and n+ region. The width of depletion layer 42 is relatively small, because both p+ and n+ regions are heavily doped. Line 46 corresponds to the conduction band. Line 48 corresponds to the valence band. Conduction band 46 and valence band 48 are separated by energy gap 50. When a body bias is applied to the transistor to reduce leakage currents (e.g., when body terminal B of FIG. 2 is biased at −0.5 volts), the conduction and valence bands in region 44 appear as shown by respective dashed lines 52 and 54. As illustrated by line 56, under these biasing conditions, electrons can tunnel across the narrow width of depletion region 42 from conduction band 46 in region 40 to valence band 54 in region 44. Holes may simultaneously tunnel in the opposite direction. The tunneling electrons and holes give rise to a leakage current between drain-source region 40 and pocket implant region 44. This leakage current represents a tunneling component of Iboff.

As this example demonstrates, band-to-band tunneling effects can lead to increases in the tunneling component of body leakage current Iboff, particularly in situations in which the body terminal has been biased in an effort to reduce source leakage current Isoff. This increase in leakage current can have a significant adverse impact on power consumption in an integrated circuit.

To address these shortcomings of modern metal-oxide-semiconductor transistors, metal-oxide-semiconductor transistors in accordance with embodiments of the present invention may be provided with gate conductors that contain multiple gate materials. The gate materials may be semiconductors such as polysilicon of different doping types or metals with different electrical characteristics (as examples). The gate materials in a given transistor are formed at different lateral locations along the channel region of the transistor (i.e., at different locations in the plane of the substrate surface).

With one suitable arrangement, which is sometimes described herein as an example, the gate conductor of each transistor is formed from multiple metals, each of which has different workfunction. Over the edge portions of the channel region that would conventionally contain a pocket implant, the gate conductor may be formed from a metal with a relatively low workfunction. In a p-channel metal-oxide-semiconductor transistor, this metal may, for example, have a workfunction of about 4.2 eV, which makes its electrical performance comparable to that of a heavily doped n-type gate conductor such as an n+ polysilicon gate conductor. Over the center portion of the channel region in the p-channel transistor, the gate conductor may be formed from a metal that has a relatively high workfunction. The center portion of the gate may, for example, have a workfunction of about 5.1 eV, which makes its electrical performance comparable to that of a heavily doped p-type gate conductor such as a p+ polysilicon gate conductor. Other arrangements may also be used such as arrangements in which the metal workfunctions for the edge and center regions differ by different amounts (e.g., by less than 0.3 eV, by 0.3 eV or more, by at least 0.6 eV, by at least 0.9 eV, etc.). NMOS transistors may also be formed that include multimetal gates.

Figure 4:
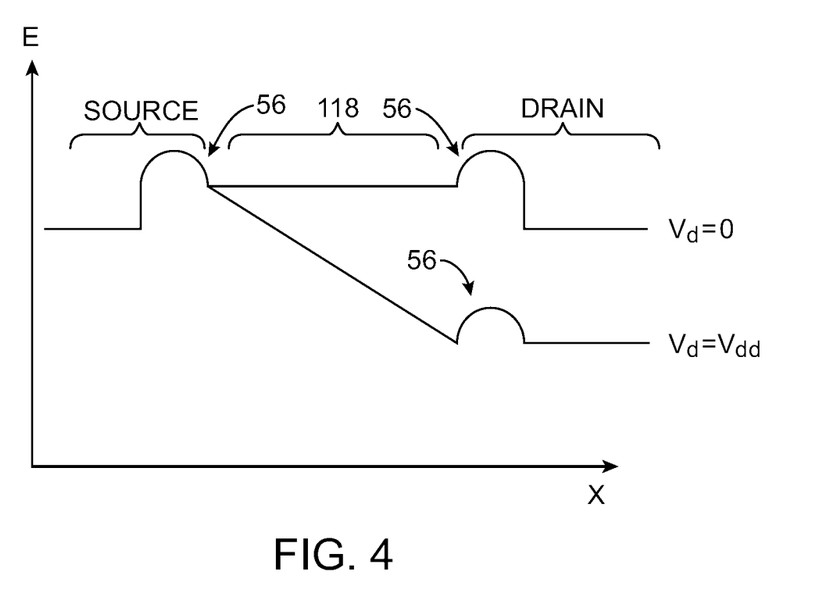
FIG. 4 is a diagram showing energy barriers associated with source and drain regions in a metal-oxide-semiconductor transistor in accordance with an embodiment of the present invention.

A transistor in which the edges of the gate conductor are formed from different types of metal than the center of the gate conductor, the band diagram for the transistor taken through the source, channel, and drain regions may have the form of the band diagram shown in FIG. 4. As shown in FIG. 4, there are source and drain energy barriers 56. Energy barriers 56 are present both when the transistor is unpowered (drain voltage Vd is at a ground voltage such as 0 volts) and when the transistor is powered (drain voltage Vd is at a positive power supply voltage Vdd such as 1.0 volts). Energy barriers 56 that are produced by using a gate conductor formed from different types of metal help to prevent short channel effects such as punchthrough, while avoiding the increases in tunneling current due to the sharp p+/n+ junctions formed from conventional pocket implants.

Figure 5:
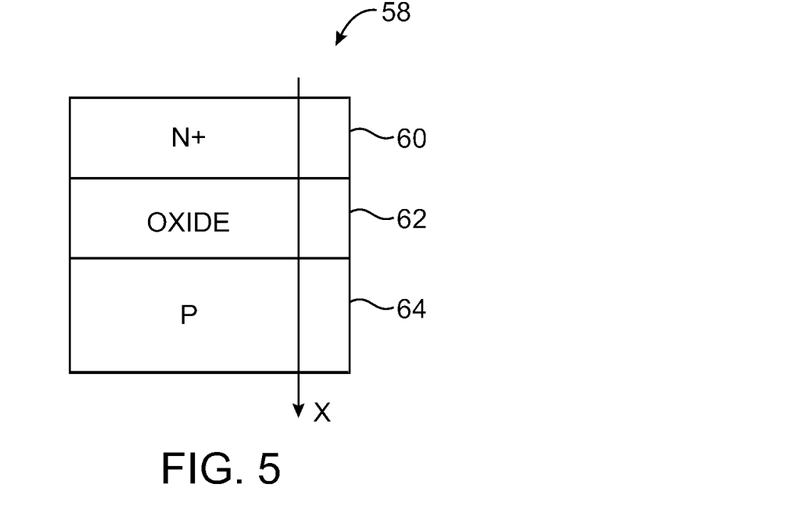
FIG. 5 is a cross-sectional diagram of a portion of a transistor gate structure in which a gate material with an n+ doping characteristic is used in conjunction with a p-type substrate doping.
Figure 6:
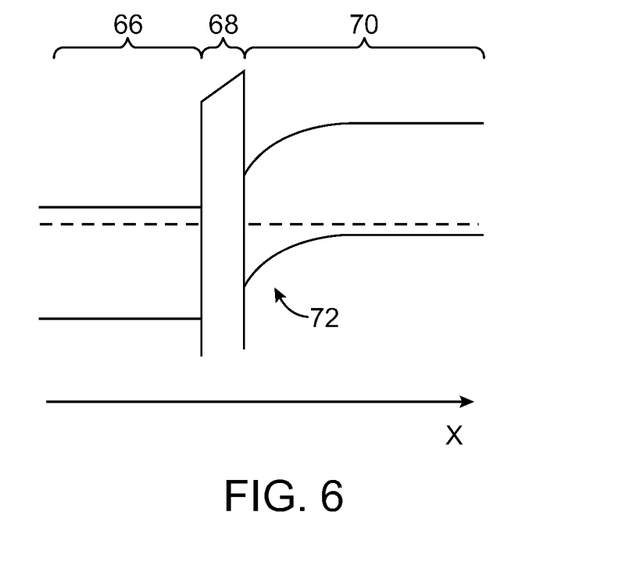
FIG. 6 is a band diagram corresponding to the structure of FIG. 5 showing how p-type substrate energy bands are bent downwards in the presence of the n+ gate structure of FIG. 5.
Figure 7:
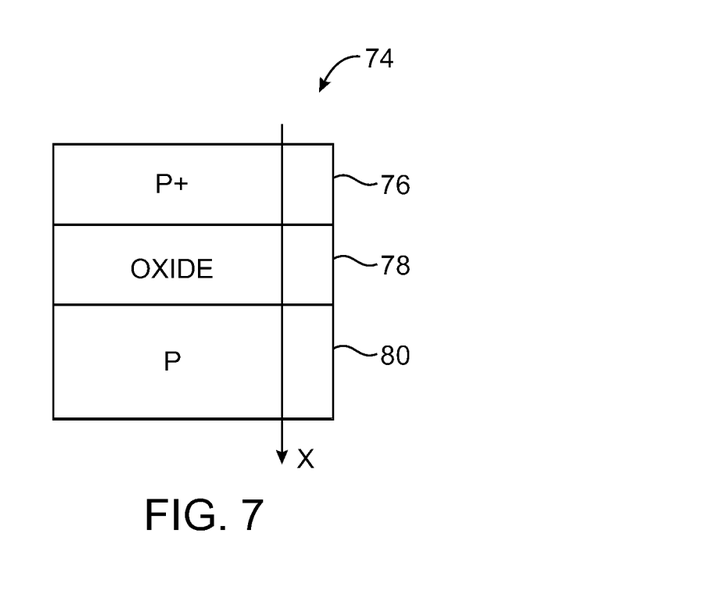
FIG. 7 is a cross-sectional diagram of a portion of a transistor gate structure in which a gate material with a p+ doping characteristic is used in conjunction with an n-type substrate doping.

The formation of energy barriers 56 may be understood by reference to FIGS. 5, 6, 7, and 8. The structures of FIGS. 5 and 7 correspond to two different portions of a transistor. In the arrangement of FIG. 5, structure 58 represents a portion of a transistor with a gate conductor 60 that has a relatively low workfunction such as that exhibited by n+ polysilicon, whereas structure 74 of FIG. 7 represents a portion of a transistor with a gate conductor 76 that has a relatively high workfunction such as that exhibited by p+ polysilicon. Gate conductors such as gate conductors 60 and 76 may be formed from any suitable metal materials including elemental metals, metal alloys, and other metal-containing compounds such as metal silicides, metal nitrides, etc. With one suitable arrangement, which is sometimes described herein as an example, gate conductors 60 and 76 are formed from metal (i.e., pure elemental metal or metal alloys). Examples of metals with lower workfunctions that may be used as gate conductors include aluminum and tantalum. Examples of metals with higher workfunctions that may be used as gate conductors include gold and tungsten. These are merely examples. Any suitable conductive materials may be used as gate conductors if desired.

Gate conductor 60 of FIG. 5 may be formed on a layer of gate insulator 62 and gate conductor 76 of structure 74 may be formed on gate insulator 78. Gate insulators 62 and 78 may be formed from any suitable material such as silicon dioxide or high-K dielectric materials (i.e., dielectrics such as hafnium silicate, hafnium dioxide, zirconium silicate, and zirconium dioxide) that have a higher dielectric constant K than silicon dioxide. In structure 58 of FIG. 5, gate insulator 62 is formed on a semiconductor substrate such as p-type silicon substrate 64. In structure 74 of FIG. 7, gate insulator 78 is formed on a semiconductor substrate such as p-type silicon substrate 80. Typical gate conductor thicknesses are on the order of a thousand angstroms to several thousand angstroms. Typical gate insulator thicknesses are on the order of 40 angstroms (as an example). Larger or smaller film thicknesses may be used if desired.

The energy band diagram of FIG. 6 corresponds to gate structure 58 of FIG. 5. Region 66 corresponds to gate conductor 60 and is shown for illustrative purposes as having a Fermi level appropriate for n+ silicon. Region 68 corresponds to gate insulator 62. Region 70 corresponds to p-type substrate 64. In equilibrium, the bands of region 70 may bend downwards as shown in FIG. 6, creating a depleted region 72 near the interface between p-type substrate 64 and gate insulator 62. This depletion region makes it easier to create an inversion layer under gate insulator 62 (i.e., in the channel region of the transistor). The presence of depletion layer 72 in transistor gate arrangements in which the gate conductor is formed from n+ semiconductor or a conductive material such as a metal with an equivalent workfunction (e.g., a workfunction of 4.2 eV), is therefore indicative of a lowered conduction band and a lowered transistor threshold voltage Vt.

Figure 8:
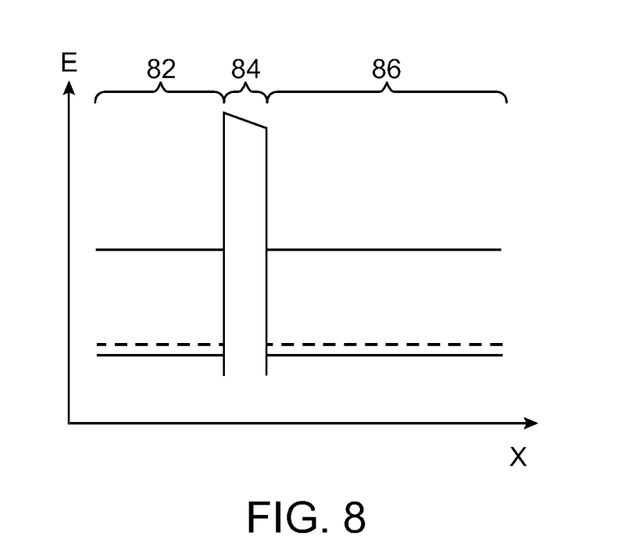
FIG. 8 is a band diagram corresponding to the structure of FIG. 7 showing how p-type substrate energy bands are relatively unaffected in the presence of the p+ gate structure of FIG. 7.

The energy band diagram of FIG. 8 corresponds to gate structure 74 of FIG. 7. Region 82 corresponds to gate conductor 76 and is shown for illustrative purposes as having a Fermi level appropriate for p+ silicon. Region 84 corresponds to gate insulator 78. Region 86 corresponds to p-type substrate 80. Because regions 76 and 80 are both p-type, there is minimal bending of the bands of region 86 in equilibrium, as shown in FIG. 8. Accordingly, transistor gate arrangements in which the gate conductor is formed from p+ semiconductor or a metal or other conductive material with an equivalent workfunction (e.g., a workfunction of 5.1 eV), tend to be characterized by conduction bands that are not lowered in the way that the conduction band in region 70 of FIG. 6 is lowered.

Figure 9:
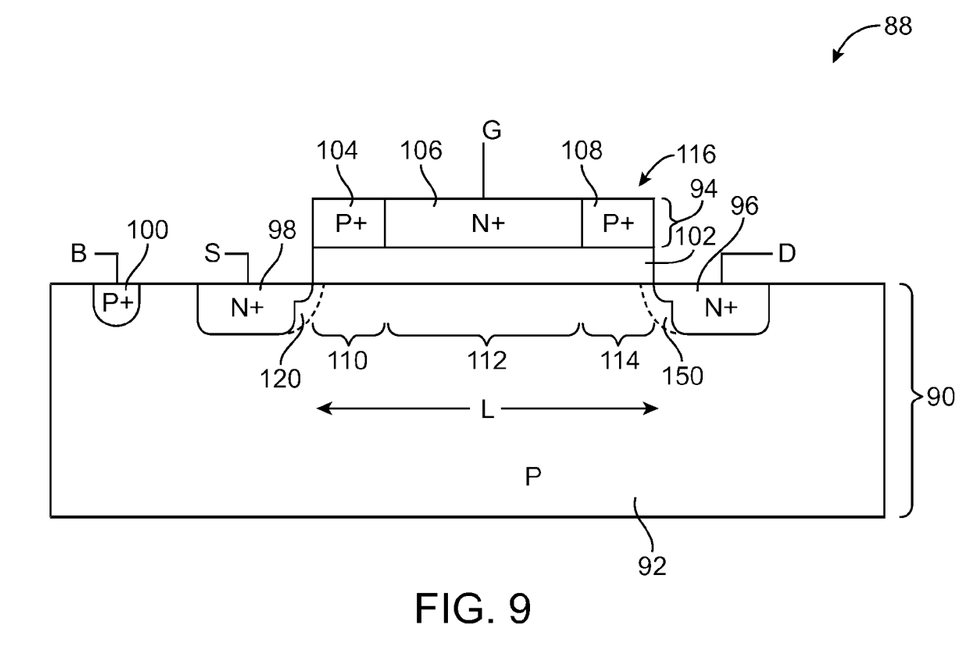
FIG. 9 is a cross-sectional diagram of an illustrative n-channel metal-oxide-semiconductor transistor in accordance with an embodiment of the present invention.

The relative behaviors of the gate structures 58 and 74 can be used to create an energy band shape of the type shown in the graph of FIG. 4. Consider, as an example, the NMOS transistor arrangement of FIG. 9. As shown in FIG. 9, transistor 88 may be formed from a semiconductor substrate 90 such as a silicon substrate. Body region 92 may be doped with p-type dopant. Body contact region 100 may be formed from a p+ ion implantation region or other heavily doped p-type region. Source region 98 and drain region 96 may be formed from n+ ion implantation regions or other heavily doped n-type regions. Gate structure 116 may have an associated gate conductor 94 and a gate insulator 102. Gate insulator 102 may be formed from a dielectric such as silicon oxide or a high-K dielectric material.

Gate conductor 94 may be formed from multiple materials. Above channel region 110 and above channel region 114, gate conductor portions 104 and 108 may be formed from metal or other conductive materials having a p+ characteristic as described in connection with FIGS. 7 and 8. These edge portions of the gate of transistor 88 will behave similarly to gate structure 76 of FIG. 7 and will not lead to a lowered conduction band in well 92. Above center channel region 112, the center portion of gate conductor 94 may be formed from a metal or other conductive material 106 having an n+ characteristic as described in connection with FIGS. 5 and 6. This will lead to a lowered conduction band for center portion 112 of body 92, as in region 118 of FIG. 4.

The multipart gate conductor 94 of FIG. 9 therefore creates an energy band profile of the type shown in FIG. 4 without the need to use conventional pocket implants and their associated abrupt p+/n+ junctions. If desired, source and/or drain pocket implants may, nevertheless, be included in transistor 88 as indicated by regions 120. Optional pocket implant regions 120 may have reduced doping concentrations relative to those used in conventional pocket implants (as an example). For example, the doping level of reduced-strength pocket implants 120 may be $10^{17}$ cm$^{-3}$ or less, $10^{18}$ cm$^{-3}$ or less, etc. (as examples).

The different materials in gate conductor 94 are sometimes said to be arranged at different lateral locations along the channel of transistor 88, because each material lies adjacent to a different respective portion of the channel region. Gate conductor edge portion 104 is adjacent to body region 110, gate conductor edge portion 108 is adjacent to body region 114, and gate conductor center region 106 overlaps center body region 112. If desired, additional conductive materials may be included in gate conductor 94. For example, a blanket layer of conductor (e.g., metal) may be formed that overlaps some or all of conductive structures 104, 106, and 108. The example of FIG. 9 is merely illustrative. The gate width of transistor 88 may be measured along the dimension perpendicular to length L (i.e., into the page of FIG. 9). Transistor 88 may have any suitable gate width. For example, transistor 88 may have a gate width that is larger than gate length L, that is more than two times the gate length L, that is more than three times the gate length L, etc.

Figure 10:
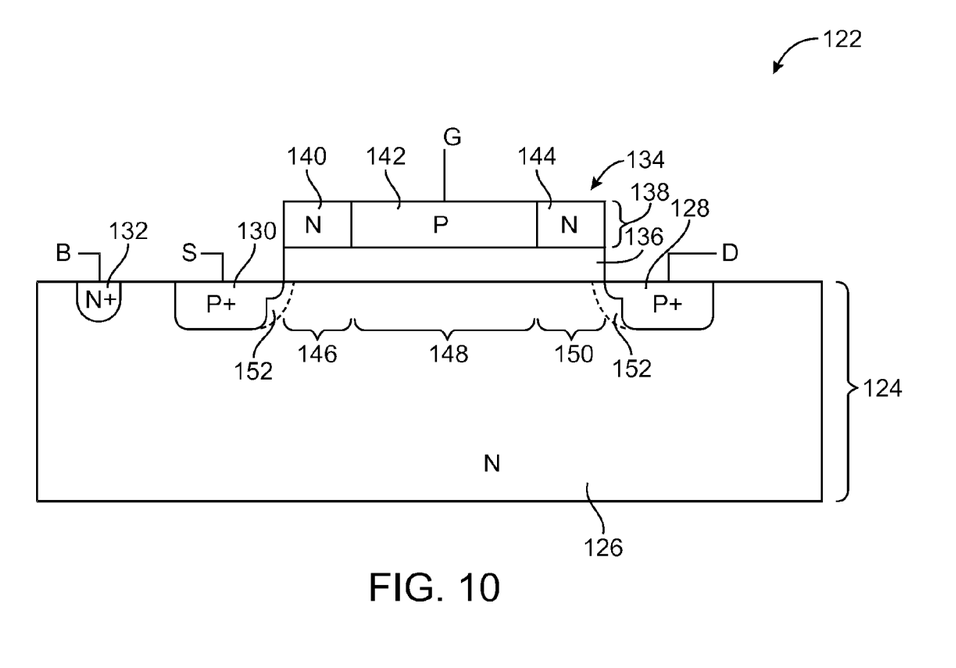
FIG. 10 is a cross-sectional diagram of an illustrative p-channel metal-oxide-semiconductor transistor in accordance with an embodiment of the present invention.

As shown in FIG. 10, a p-channel metal-oxide-semiconductor (PMOS) transistor such as transistor 122 may be provided with a gate conductor that has multiple laterally spaced portions of different materials. Transistor 122 may be formed from a semiconductor substrate 124 such as a silicon substrate. Body region 126 may be doped n-type. Body contact terminal 132 may be formed from an n+ region such as an n+ implant region. Source region 130 and drain region 128 may be formed from p+ regions such as p+ implant regions. Gate structure 134 may have a gate conductor 138 and a gate insulator 136. Gate insulator 136 may be formed from a dielectric such as silicon oxide or a high-K dielectric material. Gate conductor 138 may be formed from multiple conductive materials such as metals (pure or alloyed) or other suitable conductive materials.

Gate edge structures such as conductive gate portion 140 and portion 144 may be formed from a metal or other material that has a workfunction similar to that of n-type semiconductor material. Conductive gate portion 142 may be formed from a metal or other material that has a workfunction similar to that of p-type semiconductor material. Gate edge portion 140 is adjacent to channel region 146 of body 126, gate center portion 142 is adjacent to center channel region 148 of body region 126, and gate edge region 144 is adjacent to channel region 150 of body region 126. When placed above n-type body 126, regions 140 and 144 lead to larger conduction band heights than when region 142 is placed above body 126, leading to the creation of energy barriers 56. As described in connection with FIG. 4, energy barriers 56 may help to reduce punchthrough effects and other short channel effects without requiring the use of conventional pocket implants that might increase tunneling leakage current. Nevertheless, pocket implants may, if desired, be used in combination with the structure of FIG. 10, as indicated by optional n+ pocket implant regions 152. Pocket implant regions 152 may have lower doping levels than the doping levels used for conventional pocket implants such as doping concentrations less than $10^{17}$ cm$^{-3}$, $10^{18}$ cm$^{-3}$, etc.

An illustrative technique for forming transistors such as transistors 88 of FIG. 9 and 122 of FIG. 10 are shown in FIGS. 11, 12, 13, 14, 15, and 16. These FIGS. present cross-sectional views of metal-oxide-semiconductor transistor structures with gates formed from multiple laterally spaced conductive materials during successive phases of fabrication. The fabrication process described in connection with FIGS. 11, 12, 13, 14, 15, and 16 uses a self-aligned gate conductor formation technique in that the small lateral features required to form gate regions 140, 142, and 144 are formed in alignment with the gate oxide and structures of FIG. 11 without requiring separate photolithographic masks. This makes it possible to form gate conductors 140, 142, and 144 having lengths that are each less than length L, even if the length L corresponds to the smallest linewidth permitted by semiconductor fabrication design rules.

Figure 11:
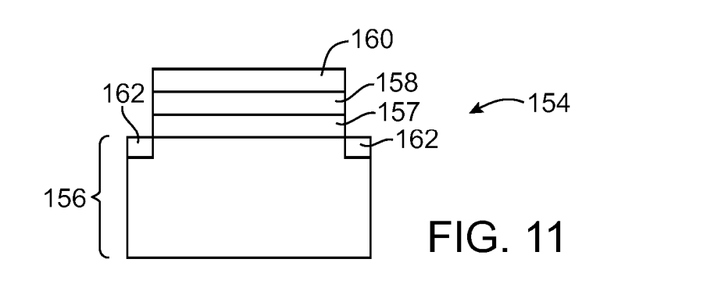
FIGS. 11, 12, 13, 14, 15, and 16 are cross-sectional diagrams of an illustrative metal-oxide-semiconductor transistor during fabrication in accordance with an embodiment of the present invention.

As shown in FIG. 11, transistor structure 154 may be formed on a semiconductor substrate such as a silicon substrate 156. Photolithographic patterning techniques may be used to form patterned structures on transistor structure 154. As shown in FIG. 11, a layer of gate insulator such as layer 157 may be formed on the surface of substrate 156. The gate insulator layer may be, for example, about 40 angstroms thick and may be formed from a dielectric such as silicon oxide or a high-K dielectric material. A first gate conductor material (e.g., a first type of gate metal or other conductive material) may be formed in a layer 158 on top of gate insulator 157. The workfunction of gate conductor material 158 may be selected depending on whether substrate 156 is p-type or n-type, as described in connection with FIGS. 9 and 10. A sacrificial (dummy) gate layer such as layer 160 may be formed on top of the layer of gate conductor 158. Layer 160 is referred to as being a sacrificial layer, because it is removed during subsequent processing steps and does not form part of the finished transistor.

After forming sacrificial gate layer 160, layers 160 and 158 may be pattered using photolithography and associated etching operations. A first ion implantation operation or other doping operation may then be performed to form doped regions such as implant regions 162. Implant regions 162 form a lightly doped portion of the source and drain regions for transistor structure 154. If desired, source and drain regions in the transistor may be formed using a single implant operation, although multiple implants are generally preferred to improve device performance.

Figure 12:
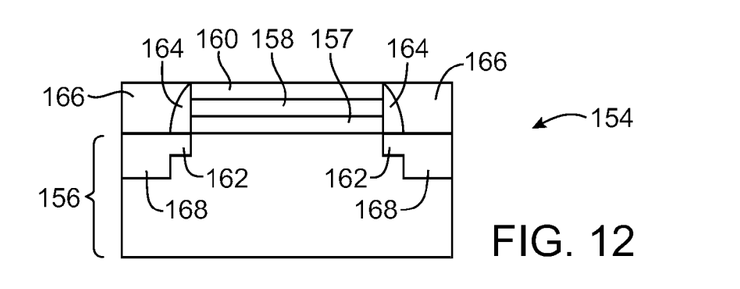

As shown in FIG. 12, gate sidewall spacers 164 may be formed on either side of layers 157, 158, and 160. Spacers 164 may be formed from silicon oxide or other suitable dielectric. Thermal oxide growth techniques or non-thermal deposition techniques may be used in forming spacers 164 and the other dielectric layers of the transistor. After spacer formation, deep implant regions 168 for the source and drain regions may be formed. During this deep implant step, spacers 164 help to prevent additional dopant from being implanted in lightly doped regions 162 and thereby serve as an implant mask for the regions 168. After completing the deep implant and thereby completing the formation of the source-drain regions for structure 154, field insulating layer 166 may be formed and planarized. Layer 166 may be formed from silicon oxide or other suitable dielectric. Planarization may be performed using a chemical mechanical polishing (CMP) process. Following planarization, transistor structure 154 may appear as shown in FIG. 12.

After layer 166 and sacrificial gate layer 160 have been planarized, sacrificial gate layer 160 may be removed to expose the upper surface 172 of gate conductor 158. For example, if sacrificial gate layer 160 is formed from polysilicon, sacrificial gate layer 160 may be removed using a polysilicon etching process. Etching may be performed using an etch process that etches polysilicon faster than the oxide, so that layers 166 and 164 are mostly unaffected by the polysilicon etchant.

Figure 13:
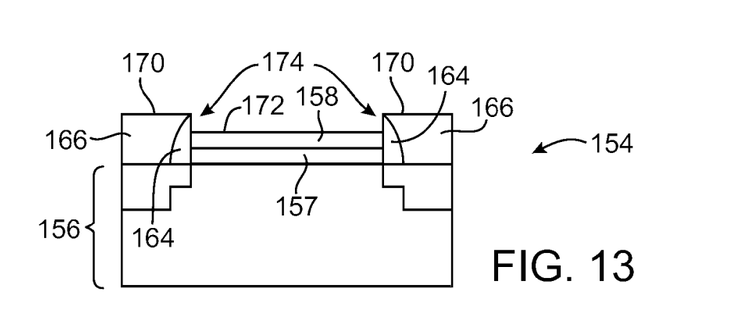

The process of removing sacrificial gate layer 160 forms stepped sidewalls adjacent to gate conductor 158. As shown in FIG. 13, after layer 160 has been removed, upper surface 170 of oxide layer 166 and spacers 164 is elevated relative to upper surface 172 of gate conductor 158. This forms exposed vertical sidewalls 174 on the inner portions of spacers 164.

Figure 14:
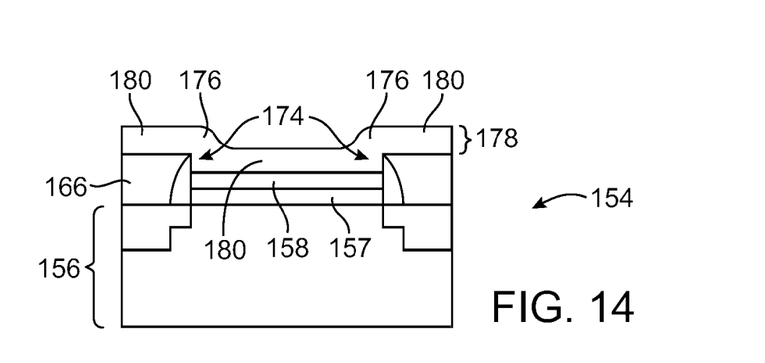

As shown in FIG. 14, after removing sacrificial gate layer 160 to form sidewalls 174, conductor 178 may be deposited. Conductor 178 may be formed from an elemental or alloyed metal or other suitable conductive material. During subsequent processing steps, portions of conductor 178 may merge with additional conductive material that forms the second of the two desired gate conductor materials for the transistor. Accordingly, it may be desirable for conductor 178 to be formed from a metal or other suitable material that has a workfunction that is different from that of gate conductor 158. In particular, as described in connection with transistor structures 88 and 122 of FIGS. 9 and 10, the workfunction of conductor 178 may be selected to be higher or lower than that of conductor 158, depending on whether an NMOS or PMOS transistor is being formed. This is, however, merely illustrative. Layer 176 may, in general, be formed from any suitable material.

A conformal deposition process such as a conformal metal deposition process may be used in depositing conductor 178. When a conformal deposition process is used, the upper surface of conductor 178 tends to follow the stepped surface contour formed by dielectric sidewalls 174, rather than forming a perfectly planar layer. As shown in FIG. 14, this results in a conductive layer with portions 180 of a given thickness and thickened portions 176. Thickened portions 176 are formed on the edges of the gate in the immediate vicinity of sidewalls 174. The thickness (vertical dimension) of thickened portions 176 is greater than the thickness of the portions 180 of gate conductor 178 that do not lie above gate conductor 158 and that are not adjacent to sidewalls 174.

Figure 15:
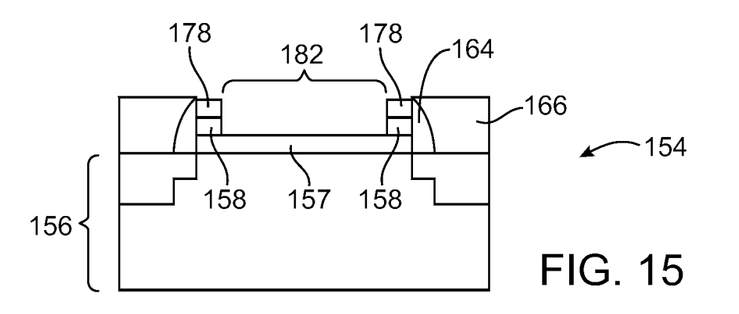

The thickened portions 176 of gate conductor 178 that are formed due to the presence of gate spacer sidewalls 174 can be exploited to create a self-aligned gate mask structure that helps in forming a portion for the transistor gate that is composed of a different gate conductor than gate conductor 158. Following the conformal deposition of conductor 176, an anisotropic etch operation may be performed to remove most of layer 178 and layer 158. During etching, thickened edge portions 176 of layer 178 serve as a mask for underlying edge portions of layer 158. Some of the thickened edge portions of layer 178 are removed during etching, but because the thickened edge portions are thicker than the other portions of layer 178, the lower portions of edge portions 176 are not removed during etching. FIG. 15 shows how edge portions of layer 178 and 158 remain following etching. The anisotropic etch may be timed so that the etch process stops when little or no gate conductor 158 remains above gate insulator 157. The inclusion of a small residual amount of gate conductor 158 in center region 182 may help to avoid damage to underlying portions of gate insulator 157.

Figure 16:
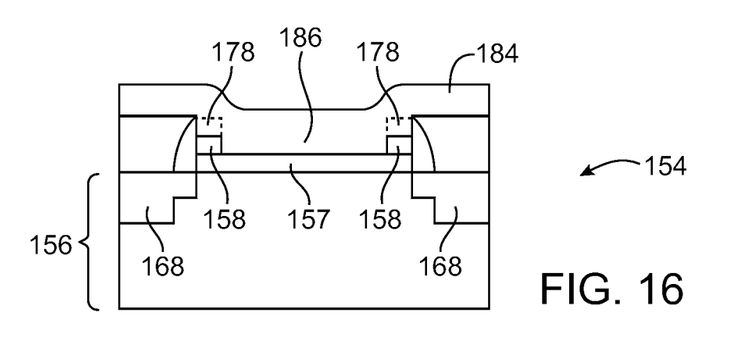

In the partially formed state shown in FIG. 15, the edge portions of the transistor gate conductor have been formed. In particular, edge portions 158 form a first gate conductor such as gate conductor edge portions 104 and 108 in FIG. 9 or gate conductor edge portions 140 and 144 in FIG. 10. As shown in FIG. 16, the center portion of the gate conductor for the transistor can be formed by depositing another layer of conductor in the opening formed in region 182 (FIG. 15). FIG. 16 shows how layer 184 may be deposited over the remaining portions of conductive layer 178 and fill center portion 186 of the transistor gate with gate conductor. Gate conductor layer 184 may be formed from the same material that was used in forming conductive layer 178 or may be formed from another metal or conductive material, provided that the resulting workfunction in center gate conductor region 186 of layer 184 has an appropriate workfunction (e.g., a workfunction of the type used by center portion 142 in PMOS transistor 122 of FIG. 10 or a workfunction of the type used by center portion 106 of the gate in NMOS transistor 88 in FIG. 9.

In portions of the integrated circuit away from the transistor 154 and its gate, layer 184 may be patterned to form electrical connections to other devices. In transistor 154, portions of layer 184 or other conductive layers may be used in forming source and drain contacts for regions 168. Body structures such as body implants and contacts for transistor body B may also be formed, as shown in FIGS. 9 and 10. Optional pocket implants may be formed (e.g., by making angled implants during fabrication to produce implant regions such as regions 152 of FIG. 10 and regions 120 of FIG. 9). These optional pocket implants may be graded and may have lower doping concentrations relative to conventional pocket implants, because the workfunction differences in the segmented gate structure assist in forming energy barriers 56 (FIG. 4). As an example, the pocket implants that are formed may have a doping concentration of $10^{17}$ cm$^{-3}$ or less, $10^{18}$ cm$^{-3}$ or less, etc. (as examples).

Figure 17:
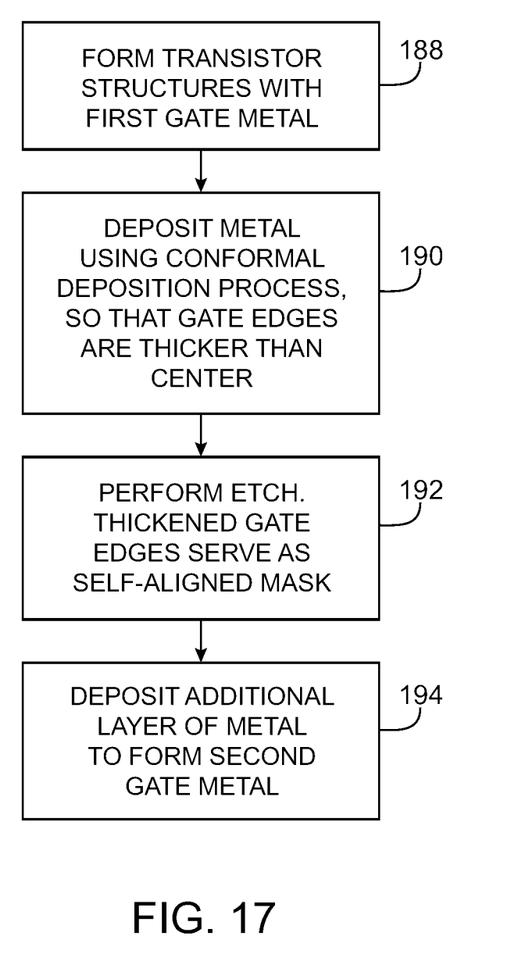
FIG. 17 is a flow chart of illustrative steps involved in fabricating a metal-oxide-semiconductor transistor in accordance with an embodiment of the present invention.

Illustrative steps involved in forming transistors with gates formed from gate conductors of different types are shown in FIG. 17.

At step 188, processing steps such as those described in connection with FIGS. 11, 12, 13, 14, and 15 may be used to form a transistor structure having a first gate conductive material, such as material 158 of FIG. 13. The first gate conductive material may be a metal or other conductive material with a suitable workfunction.

At step 190, another conductive layer may be formed such as layer 178 of FIG. 14. The deposition process of step 190 may be based on a conformal metal deposition process. Use of a conformal deposition process tends to form thickened edge portions for a self-aligned mask.

At step 192, etching may be performed to remove the center region of the first gate conductor while leaving edge portions of the first gate conductor, as shown by edge portions 158 in FIG. 15. During etching, the thickened portions 176 of layer 178 serve as a self-aligned etch mask. It is not necessary to use a photomask with minimum lateral dimensions of the same size as the minimum lateral dimensions of edge portions 158 to form edge portions 158.

At step 194, the center gate conductor may be formed in the opening in layer 158 that was formed during the operations of step 192. Center gate conductor 186 may be formed from the same material as layer 178 or may be formed from a different material. The center portion 186 of the gate conductor may be formed from material that has a different workfunction than that of the first gate conductive material in edges 178, as described in connection with FIGS. 9 and 10.

The fabrication process of FIG. 17 is merely illustrative. If desired, other techniques may be used to form transistors with gates having multiple laterally spaced gate conductors of different material types. An advantage of using self-aligned gate fabrication techniques that form multiple self-aligned gate conductor structures without using separate masks is that this reduces the burden associated with accurately aligning and forming structures with narrow widths. In particular, self-aligned gate formation techniques make it possible to form gate conductors that have linewidths less than the minimum linewidth permitted by applicable semiconductor fabrication design rules while avoiding the difficulties associated with independently aligning each such small gate conductor structure to the gate oxide.

The foregoing is merely illustrative of the principles of this invention and various modifications can be made by those skilled in the art without departing from the scope and spirit of the invention.

What is claimed is:

1. A metal-oxide-semiconductor transistor comprising:
    a gate conductor having two laterally spaced edge gate conductors and a center gate conductor located between the two edge gate conductors, wherein each edge gate conductor of the two edge gate conductors is directly in contact with the center gate conductor, wherein the metal-oxide-semiconductor transistor comprises an n-channel metal-oxide-semiconductor transistor, wherein the center gate conductor comprises an n-type gate conductor, and wherein the two edge gate conductors comprise p-type gate conductors;
    a substrate portion;
    a gate insulator formed on the substrate portion;

source and drain implant regions adjacent to the gate insulator, wherein the gate conductor is formed on the gate insulator between the source and drain implant regions; and a body contact region operable to receive a body bias voltage and operable to bias the substrate portion at the received body bias voltage, wherein the center gate conductor comprises a first metal alloy having an n-type workfunction and wherein the two edge gate conductors comprise a second metal alloy having a p-type workfunction.

2. The metal-oxide-semiconductor transistor defined in claim 1 further comprising pocket implants that separate the source and drain implant regions from a channel region under the gate insulator.

3. The metal-oxide-semiconductor transistor defined in claim 1 wherein the gate insulator comprises a dielectric selected from the group consisting of: hafnium silicate, hafnium dioxide, zirconium silicate, and zirconium dioxide.

4. The metal-oxide-semiconductor transistor defined in claim 1 wherein the body bias voltage is a negative voltage.

5. A metal-oxide-semiconductor transistor comprising:
a substrate portion;
source and drain regions in the substrate portion, wherein the source region forms a source transistor terminal of the metal-oxide-semiconductor transistor and wherein the drain region forms a drain transistor terminal of the metal-oxide-semiconductor transistor;
a gate insulator on the substrate portion between the source and drain regions;
a first gate metal on a first portion of the gate insulator between the source and drain regions, wherein the first gate metal has a first workfunction and wherein the first gate metal comprises an elemental metal;
a second gate metal that is different than the first gate metal and that is located on a second portion of the gate insulator between the source and drain regions and laterally adjacent to and directly in contact with the first gate metal, wherein the second gate metal has a second workfunction; and
a third gate metal located on a third portion of the gate insulator that is laterally adjacent to and directly in contact with the first gate metal, wherein the third gate metal has a third workfunction, wherein the substrate portion comprises a p-type substrate portion, and wherein the second and third workfunctions are greater than the first workfunction.

6. The metal-oxide-semiconductor transistor defined in claim 5 wherein the gate insulator comprises a dielectric selected from the group consisting of: hafnium silicate, hafnium dioxide, zirconium silicate, and zirconium dioxide.

7. The metal-oxide-semiconductor transistor defined in claim 5 further comprising a body contact region in the substrate portion that is operable to receive a body bias voltage.

8. The metal-oxide-semiconductor transistor defined in claim 5 further comprising pocket implants that separate the source and drain regions from a channel region under the gate insulator.

9. The metal-oxide-semiconductor transistor defined in claim 5 wherein the first gate metal is selected from the group consisting of aluminum and tantalum.

10. The metal-oxide-semiconductor transistor defined in claim 9 wherein the second and third gate metals are selected from the group consisting of gold and tungsten.

11. A metal-oxide-semiconductor transistor comprising:
a gate insulator;
a first gate conductor on a first portion of the gate insulator, wherein the first gate conductor comprises a p-type gate conductor formed from a metal material selected from the group consisting of: elemental metal, metal alloys, metal silicides, and metal nitrides;
a second gate conductor that is different than the first gate conductor and that is located on a second portion of the gate insulator and laterally adjacent to and directly in contact with the first gate conductor;
a third gate conductor located on a third portion of the gate insulator that is laterally adjacent to and directly in contact with the first gate conductor, wherein the metal-oxide-semiconductor transistor comprises a p-channel metal-oxide-semiconductor transistor and wherein the second and third gate conductors comprise n-type gate conductors;
a substrate; and
source and drain regions in the substrate.

12. The metal-oxide-semiconductor transistor defined in claim 11 wherein the first and second gate conductors have different workfunctions.

13. The metal-oxide-semiconductor transistor defined in claim 11, wherein the first and second gate conductors are formed on the gate insulator between the source and drain regions.

* * * * *